United States Patent [19]
Sugiura et al.

[11] Patent Number: 5,986,929
[45] Date of Patent: Nov. 16, 1999

[54] MULTI-LEVEL NONVOLATILE SEMICONDUCTOR MEMORY DEVICE

[75] Inventors: Yoshihisa Sugiura; Tamio Ikehashi, both of Kamakura, Japan

[73] Assignee: Kabushiki Kaisha Toshiba, Kawasaki, Japan

[21] Appl. No.: 09/080,250

[22] Filed: May 18, 1998

[30] Foreign Application Priority Data

May 22, 1997 [JP] Japan .................................. 9-132396

[51] Int. Cl.$^6$ .................................................. G11C 16/06
[52] U.S. Cl. .............................. 365/185.03; 365/185.21; 365/185.22
[58] Field of Search ........................... 365/185.03, 185.2, 365/185.21, 185.22

[56] References Cited

U.S. PATENT DOCUMENTS

| | | | |
|---|---|---|---|
| 5,570,315 | 10/1996 | Tanaka et al. ...................... | 365/185.22 |
| 5,596,526 | 1/1997 | Assar et al. ......................... | 365/185.17 |
| 5,602,789 | 2/1997 | Endoh et al. ....................... | 365/185.22 |
| 5,675,537 | 10/1997 | Bill et al. ............................ | 365/185.22 |
| 5,754,469 | 5/1998 | Hung et al. ......................... | 365/185.03 |

OTHER PUBLICATIONS

Tae–Sung Jung et al., "A 3.3V 128Mb Multi–level NAND Flash Memory for Mass Storage Applications"; ISSCC 1996 Digest of Technical Papers, vol. 31; pp. 32–33.

*Primary Examiner*—Son Mai
*Attorney, Agent, or Firm*—Banner & Witcoff, Ltd.

[57] ABSTRACT

The threshold voltage distribution for write operation into memory cells of a multi-level nonvolatile semiconductor memory device is precisely controlled and the verify result of written data is simultaneously detected for each page. For example, at the "10" data write time, excess write of "00" data which is a conventional problem is inhibited by controlling a path for transferring a lower bit to a bit line according to an upper bit. Further, at the write-verify time, the verify result can be simultaneously detected for each page by controlling the verify operation according to the upper bit. At the write time of "01" data, the bit line path is controlled by use of the lower bit and the write operation of "00" data is inhibited. Also, at the write-verify time, the verify result can be simultaneously detected for each page by controlling the verify operation according to the lower bit. The write and verify operations of "00" data can be effected in the same manner as in the case of "01" data by first inverting the lower bit of "00" data. Since the write operation can be effected while all of the write states of a plurality of bits are verified, each level of written data can be precisely controlled without causing excess or insufficiency in the threshold voltage after the write operation into the memory cell. Further, since the verify result can be simultaneously detected for each page, time can be significantly reduced.

20 Claims, 11 Drawing Sheets

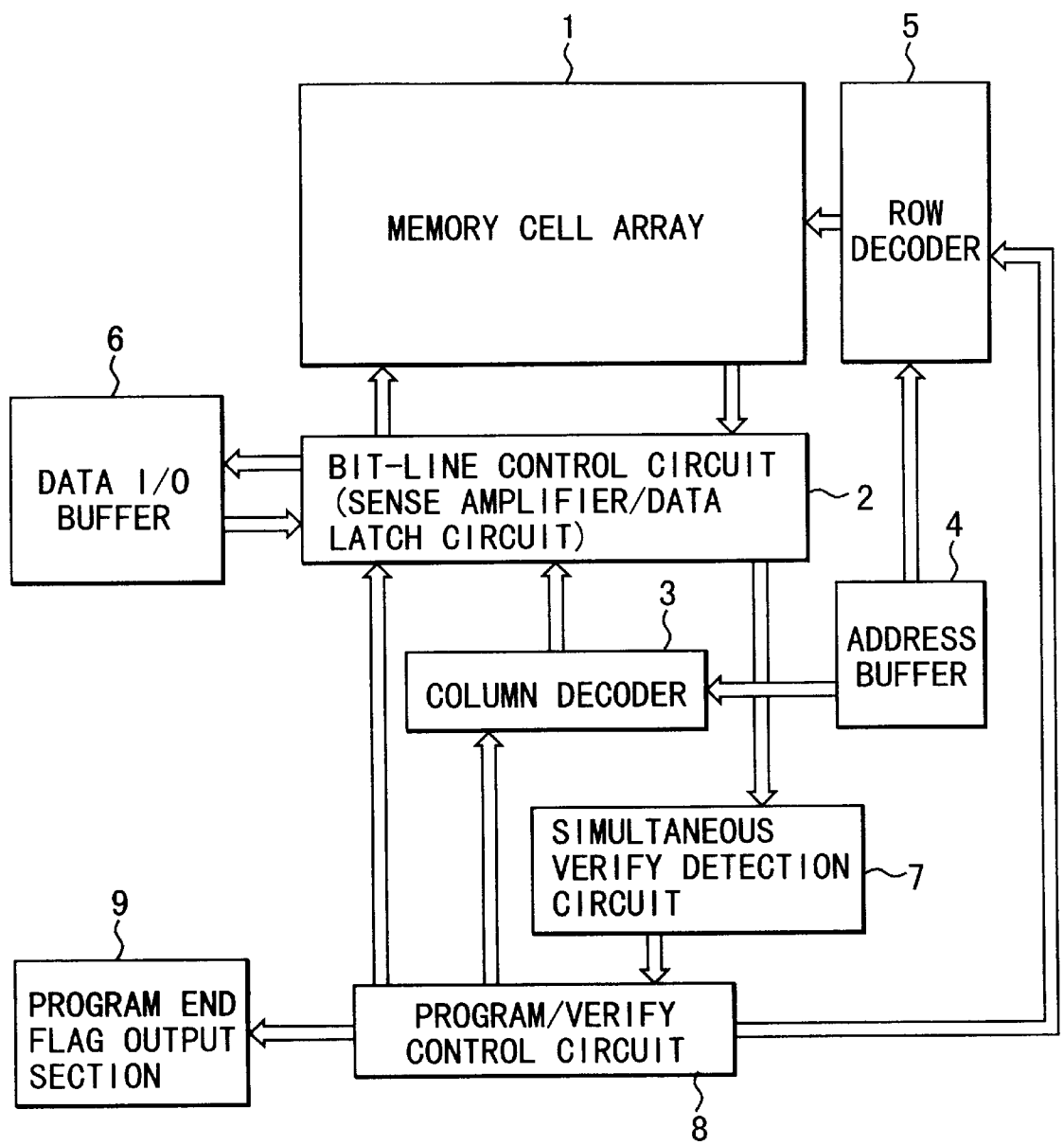
F I G. 5

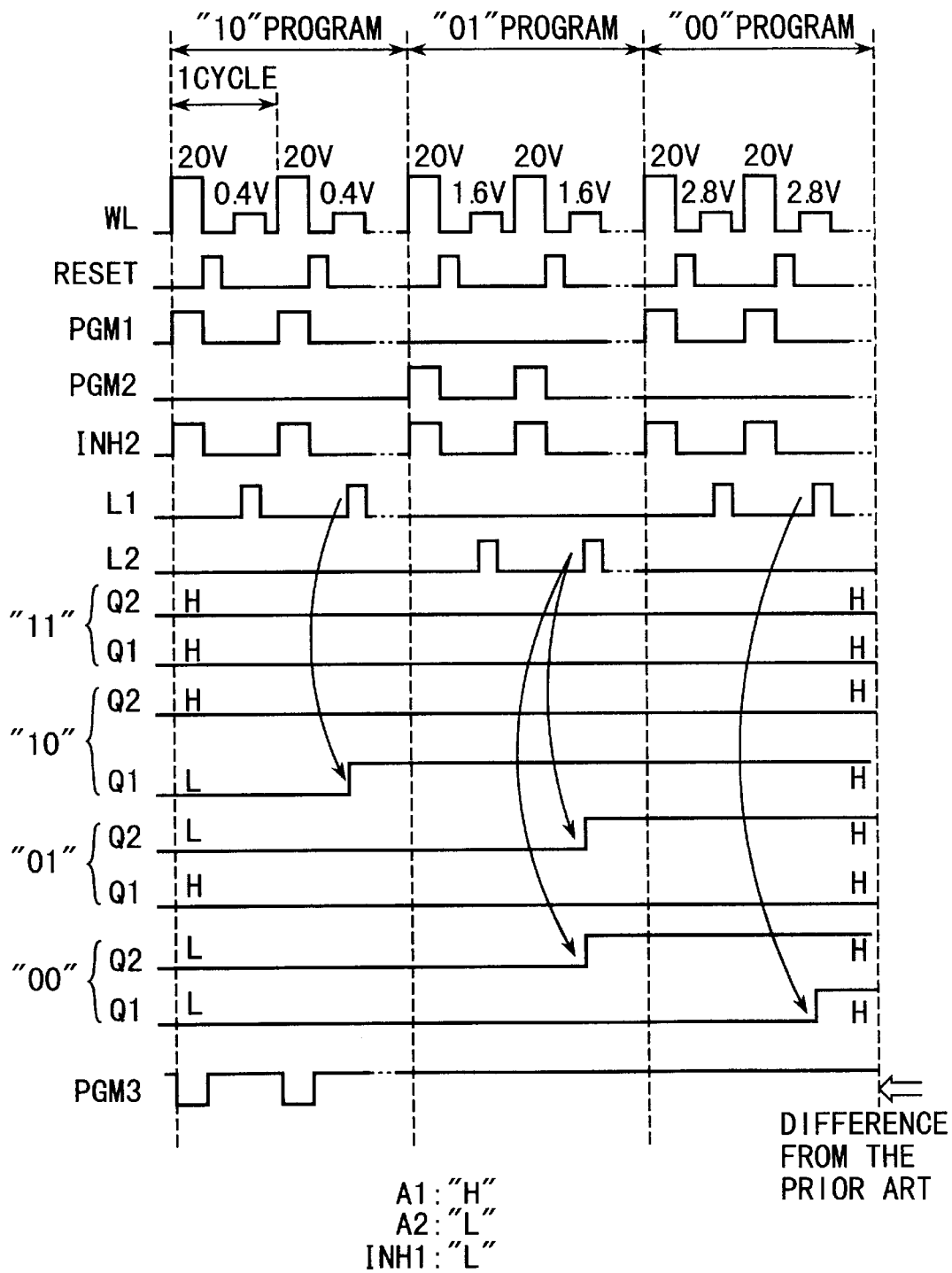
F I G. 7

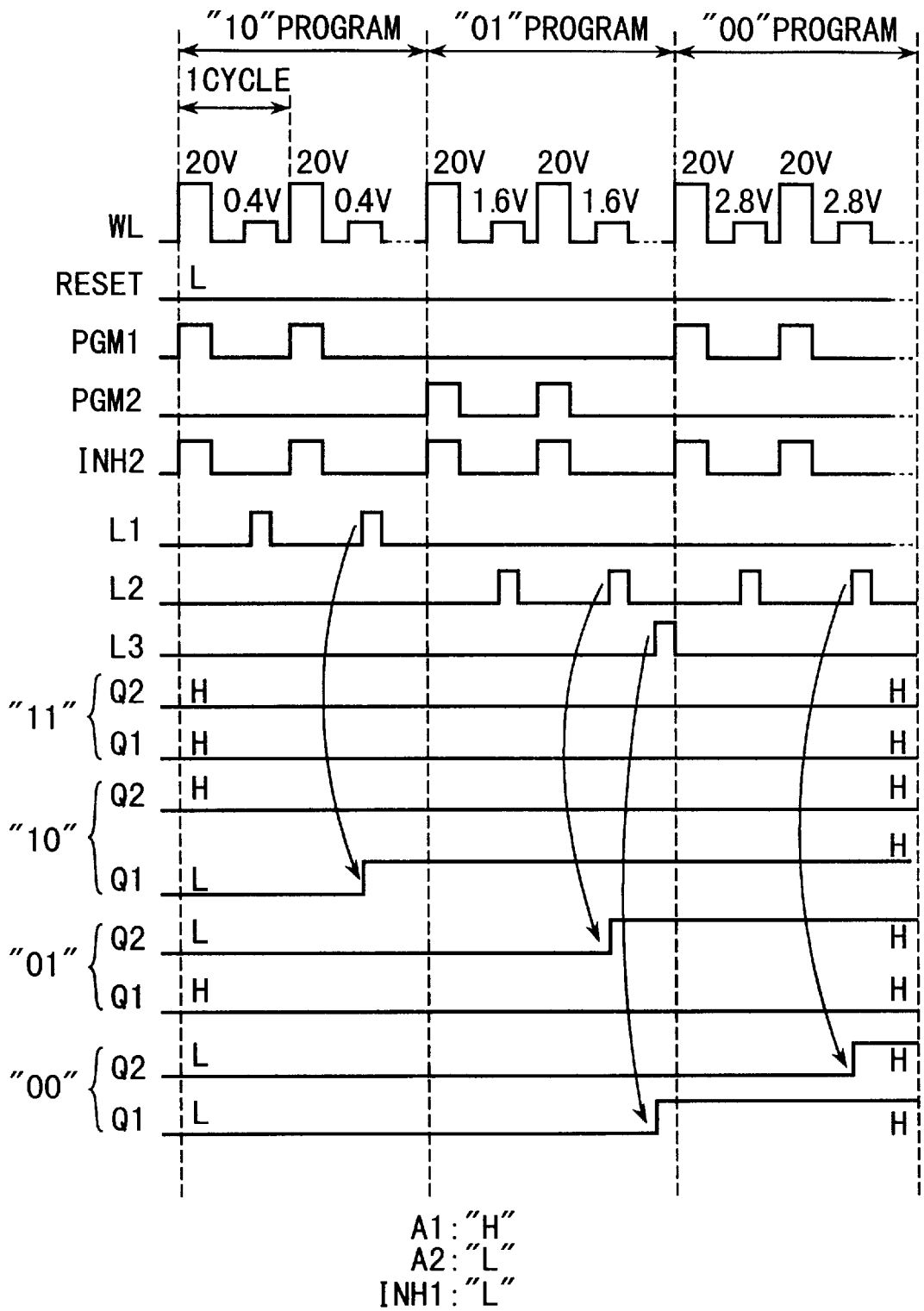
F I G. 1 2

MULTI-LEVEL NONVOLATILE SEMICONDUCTOR MEMORY DEVICE

BACKGROUND OF THE INVENTION

This invention relates to a multi-level nonvolatile semiconductor memory device, and more particularly to a multi-level nonvolatile semiconductor memory device in which multi-level information is written into a memory cell in a plurality of write-phases and the verify operation for written data is effected in order to precisely control the threshold voltage distribution in the written state of the memory cell for each write-phase.

Conventionally, the write and read operations for the multi-level nonvolatile semiconductor memory device having four memory states in one memory cell are effected as follows.

In a memory cell transistor having a floating gate structure, the threshold voltage thereof is shifted to one of four regions shown in FIG. 1 by controlling the number of electrons injected into the floating gate by use of the control gate formed above the floating gate at the write time.

The memory states are defined such that the regions of the threshold voltage Vth of the memory cell transistor of $Vth \leq -2.0V$, $0.4V \leq Vth \leq 0.8V$, $1.6V \leq Vth \leq 2.0V$ and $2.8V \leq Vth \leq 3.2V$ are respectively represented by two bits of "11", "10", "01" and "00". Further, 0V, 1.2V and 2.4V indicated on the abscissa of FIG. 1 are voltages applied to the word line when "10", "01" and "00" are read out.

One example of a sense/latch circuit of the conventional four-level nonvolatile semiconductor memory device including NAND-type flash memory cells is shown in FIG. 2. The circuit is disclosed in ISSCC 1996 digest of Technical Papers, vol. 31, pp. 32–33.

A memory cell array 1 includes NAND-type cells each including a plurality of serially connected memory cells having the floating gate structure. In this case, a series circuit of memory cells MC0 to MC15 is connected at one end to a bit line BL1 via a drain side selection transistor S1 and connected at the other end to a preset power supply terminal (which is normally grounded) which is indicated by an arrow via a source side selection transistor S2.

WL0 to WL15 are word lines, and SGD, SGS are drain side and source side selection lines. Sense amplifiers each having a first latch circuit 10 and second latch circuit 11 for holding four-level information are arranged one for every two bit lines. In the following description, the first latch circuit 10 is referred to as LATCH1, the second latch circuit 11 is referred to as LATCH2, and the sense amplifier including LATCH1 and LATCH2 is referred as a sense/latch circuit.

In a NAND-type flash memory, the threshold voltages of unselected memory cells serially connected to the selected memory cell at the readout operation, for example, are set to be lower than the word line voltage and the unselected memory cells must be set in the ON-state.

Further, since the data write operation, the verify operation for the write state (which is hereinafter simply referred to as "verify"), and the readout operation for the multi-level nonvolatile semiconductor memory device are effected for each page unit, data of one page is temporarily held in the sense amplifiers including the data-latch circuits at the write time, the data is output to the bit lines and the write voltage is applied to the word lines so as to write data into the memory cells, and at the readout time, the readout voltage is applied to the word lines and information items read out to the bit lines are fetched into the sense amplifiers having the data-latch circuits.

Conventionally, in the write and read operations, an example of the voltages of the selection lines and the word lines of the memory cell array is shown in TABLE 1.

TABLE 1

|  | WRITE | READ |
|---|---|---|
| SDG | Vcc | 6 V |
| WLi − 1 | 0 V | 6 V |
| WLi (SELECTED) | 20 V | 2.4/1.2/0 V |
| WLi + 1 | 0 V | 6 V |
| WL (OTHERS) | 11 V | 6 V |
| SGS | 0 V | 6 V |

WLi−1, WLi (SELECTED), WLi+1 indicate the voltages of a selected word line and neighboring word lines. A midlevel voltage of 11V is applied to the unselected word lines which are different from the above word lines and the above neighboring word lines are applied with a word line voltage 0V for setting the channel into the electrically floating state for local self-boosting of the channel of the selected memory cell. The selected word line is applied with a write voltage 20V.

If a write method by self boosting is used, the voltage amplitude from the write voltage 0V to approx. 10V (write-inhibit midlevel voltage) supplied to the bit line at the write time in the normal fixed voltage write method can be lowered to the voltage amplitude from 0V to 3.3V (Vcc) and the midlevel voltage generation circuit for bit line voltage can be omitted.

The write method by self boosting is described in detail in K. D. Suh et al., IEEE Journal of Solid State Circuits, vol. 30, No. 11, pp. 1149–1156 (1995) and the write method by local self boosting is described in detail in T. S. Jung et al., ISSCC 1996 Digest of Technical Papers, p. 32.

Next, the write and verify operations of the conventional four-level nonvolatile semiconductor memory device are specifically explained with reference to FIGS. 2 and 3. FIG. 3 is a timing diagram for illustrating the write and verify operations of the circuit of FIG. 2.

DECOUPLE in FIG. 2 indicates a control line for separating the memory cell array 1 so as to prevent the voltage at the erase time from influencing the sense/latch circuit at the erase time for the memory cell and controlling the voltage to enhance the speed of the sensing operation. In the following description, the operation of DECOUPLE is not particularly described since it is not directly related to this invention.

The sense/latch circuit 2 includes LATCH1 and LATCH2 surrounded by broken lines 10, 11. INH1, INH2 are inhibit signals for supplying Vcc to the bit lines at the write time, and Vref is a reference voltage used for readout or the like. Vref is applied to the gate of the transistor which operates as a precharge transistor at the readout time according to whether the precharged voltage to the bit line is discharged or maintained. A1, A2 are address signals of the bit lines, RESET is a reset signal, and PGM1 PGM2 are program signals supplied in the write operation sequence for the four-level data.

Further, N1 is a node for connecting the connection nodes of the address signal input transistors and the program signal input transistors which are respectively connected in series with the bit lines BL1, BL2 and the node is hereinafter referred to as N1 or node one. The drain of the reset transistor is also connected to N1. L1, L2, L3 are read signals used for reading out information written into the memory cell to LATCH1, LATCH2 and 3 indicates a column decoder.

In the circuit of FIG. 2, the arrows are normally grounded but may be connected to a preset power supply terminal (this is also applied to FIG. 6 and FIGS. 9 to 11).

As described before, in order to write data into the memory cell, approx. 20V is applied to the control gate and 0V is applied to the channel of the substrate surface to inject electrons into the floating gate which lies below the control gate by the tunneling phenomenon. The voltage of the channel of the substrate surface of the non-write cell which commonly has a word line with the write cell is set to approx. 10V so that the probability of occurrence of the above tunneling phenomenon will be significantly reduced and thus the data writing can be inhibited.

Using the self boosting for boosting the power supply voltage vcc supplied from the bit line, the channel voltage is boosted to approx. 10V by setting the channel into the electrically floating state, dividing the voltage applied to the control gate by capacitance division by use of the inter-electrode capacitance of the memory cell. Therefore, it is understood that the bit line voltage for the write inhibited cell may be set to Vcc.

In order to give four-level memory states to a memory cell, as shown in FIG. 3, the threshold value of the cell is controlled in three stages of "10" program, "01" program and "00" program. First, four-level data is written into the memory cell on the bit line BL1 selected by the address signal A1.

At the write time, write information is supplied to LATCH1, LATCH2 as 2-bit data (Q2, Q1) according to the definition of FIG. 1. Q1, Q2 are voltage levels of the nodes of the latch circuit at which LATCH1 and LATCH2 shown in FIG. 2 are connected to the respective bit lines. That is, "10" data is loaded in the latch circuit as Q1: L and Q2: H, "01" data is loaded in the latch circuit as Q1: H and Q2: L, and "00" data is loaded in the latch circuit as Q1: L and Q2: L.

The write operation is effected for each page unit and the verify operation is effected for each bit. In this conventional case, the verify operation is effected by detecting the current in the bit line after the write operation. In addition, a method for judging data based on whether or not the precharge voltage of the bit line is maintained is provided.

In the "10" program of FIG. 3, A2 is first set to "L", INH2 is set to "H" to separate the bit line BL2, and information of the lower bit Q1 is transferred to the bit line BL1 with PGM1 and the address signal A1 set at "H". At this time, if Q1 is "L", the bit line is normally grounded.

After this, the write voltage 20V is applied to the selected word line for a preset period of time as shown by WL in FIG. 3, then the voltage of WL is returned to the verify voltage 0.4V of "10" data and the program-verify operation is effected.

If the threshold voltage of the memory cell exceeds 0.4V by the write voltage, the memory cell is set into the OFF state. Therefore, no current flows in the bit line and the bit line voltage is applied to M1 and "H" of Q2 is input to M2 so that the inverted node Q1B of Q1 will be grounded via M1, M2, M3 by supplying a read signal L1 to M3, and as shown by an arrow in FIG. 3, Q1 is inverted to "H". At this time, "L" of Q1 in "00" data is cut OFF by M2 since Q2 is "L" and it will not inverted to "1".

In this case, L1 is used as a signal for verifying the write state, but as described before, since the verify operation is also effected by reading out the write state to the latch circuit, L1 is referred to as the read signal in the verify operation in the following description. This is also applied to L2, L3.

Further, the connection node Q1 of LATCH1 connected to BL1 via a plurality of serially connected transistors is referred to as one of the nodes of LATCH1 and Q1B is referred to as the inverted node of LATCH1. This is also applied to Q2, Q2B.

The "10" program is Terminated after a sequence of write and verify operations are repeated by a number n (n is a natural number of n≧1) of times until "10" data is normally written to all the memory cells into which "10" data is to be written. Since the write operation is inhibited if Q1 is "H" at the write time, the write operation is effected only in the case of "00" and "10" in the "10" program.

If data is "10" in the above case and the threshold value of the memory cell becomes equal to or higher than 0.4V in the i-th (i is a natural number of n≧i≧1) write operation, Q1 is inverted to "H" when M3 is turned ON and the (i+1)-th and succeeding write operations are inhibited.

However, since Q1 is not inverted to "H" unlike the above case if data is "00", the write operation is repeated by n times until the "10" program is terminated.

Next, "L" of Q2 of LATCH2 is transferred to the bit line BL1 by PGM2 and A1 in the "01" program and the write voltage 20V is applied to the word line WL of the memory cell for a preset period of time so as to effect the write operation. Then, the voltage of WL is returned to the verify voltage 1.6V of the "01" data and the program-verify operation is effected. If the threshold value of the memory cell exceeds 1.6V, no detection current flows, the inverted node Q2B of Q2 is grounded by M4 which is applied with the detection voltage and M5 which is supplied with the read signal L2, and as shown by two arrows shown in FIG. 3, Q2 is inverted to "H". At the same time, Q2 of the "00" data is also inverted to "H" as indicated by the two arrows.

Finally, if the threshold voltage of the memory cell exceeds 2.8V in the "00" program, Q1 of the "00" data is inverted to "H" by the read signal Li as indicated by the arrow of FIG. 3. The write operation effected in the "00" program is effected only for the memory cell into which "00" data is written. Thus, after the respective programs of "10", "01", "00" are effected, all of Q1, Q2 giving four-level data are inverted to "H" and it is verified that four-level data written into the memory cell is not insufficiently written. However, in the conventional write and verify operations explained here, an unpreferable write operation is repeated for the memory cell into which "00" data is written at the same time that "10" data is written in the "10" program as described before, and over-program of "00" data may occur.

Next, the readout operation of four-level data is explained. Readout of data to LATCH1, LATCH2 is effected in three divided phases as shown in FIG. 4. Prior to the readout operation, the RESET signal, PGM1, PGM2 signals are set to "H" and all of the nodes Q1, Q2 are set to "L" so as to reset LATCH1, LATCH2. In the readout operation, L1 is set to "L".

In the phase1, the lower bit Q1 of "00" data written in the memory cell is read out. The word line connected to the control gate of the memory cell is set to 2.4V. If the threshold value of the memory cell is equal to or higher than 2.4V, that is, it is included in the distribution of "00" shown in FIG. 1, the memory cell in which "00" data is written is set in the OFF state, no current flows in the bit line and a voltage is detected, but a current flows in the bit line and it is grounded in the case of the other write data.

The bit line voltage is applied to the transistor M1 and fetched into LATCH1 by the read signal L3 which is input to M20, but at this time, the readout operation is controlled by Q2B via M19. Since Q2 is set to "L" in the reset operation previously effected, Q2B is set at "H", and therefore, M19 is turned ON and Q1B is grounded via M1, M19, M20 and set to "L" so that only the lower bit Q1 of the "00" data may be read out as "H" to LATCH1 in the phase1 as shown in FIG. 4.

In the phase2, the word line potential is set to 1.2V and the upper bits Q2 of "01" data and "00" data are read out. The bit line voltage is applied to the transistor M4, Q2B of the LATCH2 is grounded by the read signal L2 input to M5 and Q2 is set to "H" so that the upper bit of the "01" data is read out as shown in FIG. 4. At this time, Q2 of the memory cell in which the "00" data is written is also set to "H".

In the phase3, the word line is set to 0V and the lower bit of "10" data is read out. The bit line voltage is applied to M1. The bit line potential is set at a high level in any case of "00", "01", "10", but since M19 is controlled by Q2B, Q1 is not inverted in the case of "01" data, Q2B is already set at "L" at this time in the case of "00" data, and only Q1 of "10" data is correctly read out by the read signal L3.

The voltages of the nodes (Q2, Q1) after the above three phases are effected are set to (L, L), (L, H), (H, L), (H, H) when the states of the selected cell are "11", "10", "01", "00" as shown on the right side of FIG. 4.

As described above, in the conventional sense/latch circuit, since "10" data is written without inhibiting the write operation of "00" data at the write time of "10" data when "10", "01", "00" are separately written in the separate phases, the write state of "10" data can be verified, but at the same time, the threshold voltage of the memory cell into which "00" data is written is shifted, and since the verify operation does not respond to the shift amount at all, there occurs a possibility that over-program of "00" data may occur in a case where the write characteristics of the memory cells in one page significantly deviate.

Further, when the threshold value of the memory cell is set to 6V or more by the over-program, no current flows even if a voltage of 6V as shown in TABLE 1 is applied to the unselected word line and there occurs a problem that a read error of information of the selected cell will occur. That is, in the NAND-type flash memory, since an over-programmed cell prevents readout of data from the cell serially connected to the same string, the above problem becomes serious in the multi-level flash memory in which the threshold value of the memory cell must be precisely controlled.

Further, in the conventional circuit, since Q1 of "00" data which lies in the same page is "L" after all of "10" data items are correctly written at the "10" verify time, for example, it is impossible to simultaneously effect the verify detection for each page unit. Therefore, a problem that the verify time becomes longer occurs since the readout operation only for Q1 of the sense/latch circuit in which "10" is loaded becomes necessary by scanning inner column address for each byte unit in the "10" verify operation.

BRIEF SUMMARY OF THE INVENTION

A multi-level nonvolatile semiconductor memory device of this invention is characterized in that the write operation of data items of "10", "01", "00" can be precisely controlled without increasing the number of latches and the number of signal lines, and particularly, over-program of "00" data does not occur. Further, an object of this invention is to make it possible to simultaneously detect the result of program-verify operation for each page unit.

More specifically, a multi-level nonvolatile semiconductor memory device of this invention comprises a memory cell array having a plurality of rewritable memory cells for storing multi-level information arranged in a matrix form; a signal line for transferring a signal with respect to the memory cell array; and a plurality of sense/latch circuits in which write data items to be simultaneously written into a plurality of memory cells of the memory cell array are latched; wherein each of the sense/latch circuits includes a plurality of latch circuits, each of the plurality of latch circuits is connected to the signal line via at least one control circuit, and there is provided a write phase in which the voltage level of one of the nodes of the latch circuit which is a connection node of one of the plurality of latch circuits and the control circuit is inhibited from being transferred to the signal line when the potential of one of the nodes of another latch circuit which is a connection node of the other latch circuit and the control circuit is at a low level.

Further, in the multi-level nonvolatile semiconductor memory device of this invention, each of the sense/latch circuits includes first and second latch circuits, one of the nodes of the first latch circuit is connected to one terminal of a first serially connected control circuit, one of the nodes of the second control circuit is connected to one terminal of a second serially connected control circuit, the other terminals of the first and second serially connected control circuits are connected to the signal line, and a node one for connecting the other terminals of the first and second serially connected control circuits is connected to a voltage terminal for supplying a write inhibit voltage to the signal line via a third serially connected control circuit.

A write phase is provided in which the write inhibit voltage is supplied from the voltage terminal when the potential of one of the nodes of the first latch circuit and the potential of one of the nodes of the second latch circuit are both set at the low level.

Thus, in the write and verify operations of "10" and "01" data, occurrence of over-program of "00" data can be prevented.

In the multi-level nonvolatile semiconductor memory device of this invention, each of the sense/latch circuits includes a first latch circuit for holding lower bit data and a second latch circuit for holding upper bit data, has a first transfer control circuit for controlling transfer of the lower bit data held in the first latch circuit to the signal line by use of the upper bit data held in the second latch circuit and a second transfer control circuit for controlling transfer of the upper bit data to the signal line by use of the lower bit data held in the first latch circuit, and the write operation of multi-level information into the memory cell by use of the upper and lower bit data items is effected in different write phases.

Thus, in the write and verify operations of "10" and "01" data, since the write operation of "00" data can be completely inhibited, occurrence of over-program of "00" data can be prevented.

Each of the sense/latch circuits of the multi-level nonvolatile semiconductor memory device of this invention includes a first latch circuit for holding lower bit data and a second latch circuit for holding upper bit data, the write operation of multi-level information into the memory cell is effected in different write phases by use of the lower bit data held in the first latch circuit and the upper bit data held in the second latch circuit, and it further includes an inversion circuit for forcedly inverting bit data held in one of the first and second latch circuits in a specified write phase according to an external signal.

Thus, since the number of the write states in which data is held in the first and second latch circuits is reduced by inverting one of the bit data items in one of the write phases, the circuit construction can be simplified.

Preferably, the multi-level nonvolatile semiconductor memory device of this invention includes a verify circuit for inverting the potential of one of the nodes of the first and second latch circuits in the sense/latch circuit according to the result of verify and a detection circuit for detecting the voltage level of one of the nodes of the first and second latch circuits and simultaneously detects whether or not the write operation for a plurality of memory cells is sufficiently effected in each write phase.

With the above construction, time required for verify of data written into the memory cells can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a block diagram of a multi-level nonvolatile semiconductor memory device of this invention;

FIG. 7 is a timing diagram for illustrating the write and verify operations of the multi-level nonvolatile semiconductor memory device according to the first embodiment of this invention;

FIG. 12 is a timing diagram for illustrating the write and verify operations of the multi-level nonvolatile semiconductor memory device according to the fourth embodiment of this invention.

DETAILED DESCRIPTION OF THE INVENTION

There will now be described embodiments of this invention in detail with reference to the accompanying drawings.

FIG. 5 is a block diagram showing the construction of a multi-level nonvolatile semiconductor memory device which is common throughout the whole embodiments of this invention. 1 denotes a memory cell array having cell units each of which is constructed by connecting a multi-level nonvolatile memory cell having a floating gate and a control gate in a NAND-type configuration and which are arranged in an array form.

2 denotes a bit line control circuit including a sense amplifier/data latch circuit which is a main portion of this invention and the bit line control circuit effects the bit line control for the write, verify and readout operations of memory data with respect to the memory cell array 1. As described before, this is referred to as a sense/latch circuit.

3 denotes a column decoder for receiving a signal of an address buffer 4 and transferring a decoded address signal to the bit line, and 5 denotes a row decoder for receiving a signal of the address buffer 4 and transferring a decoded signal to the word line of the memory cell array 1.

6 denotes a data I/O buffer circuit for transferring data with the sense/latch circuit, 7 denotes a simultaneous verify detection circuit for simultaneously detecting the result of verify operation for each bit in a page, 8 denotes a program/verify control circuit for controlling the operations such as the write operation of data into the memory cell array 1 and the program-verify operation, and 9 denotes a program end flag output section for detecting the end of a program.

Figure 2:
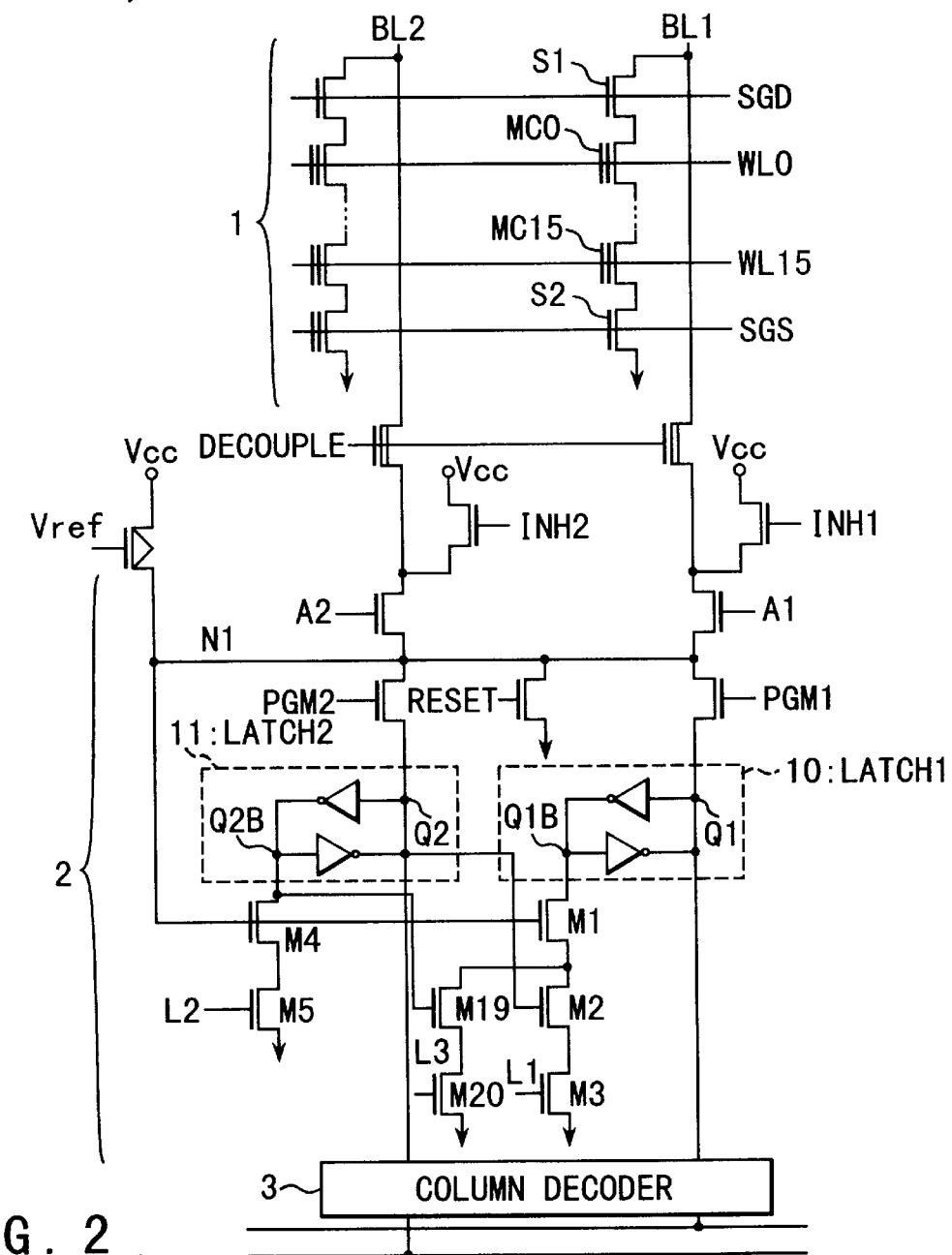
FIG. 2 is a diagram showing the circuit construction of a conventional multi-level nonvolatile semiconductor memory device.
Figure 6:
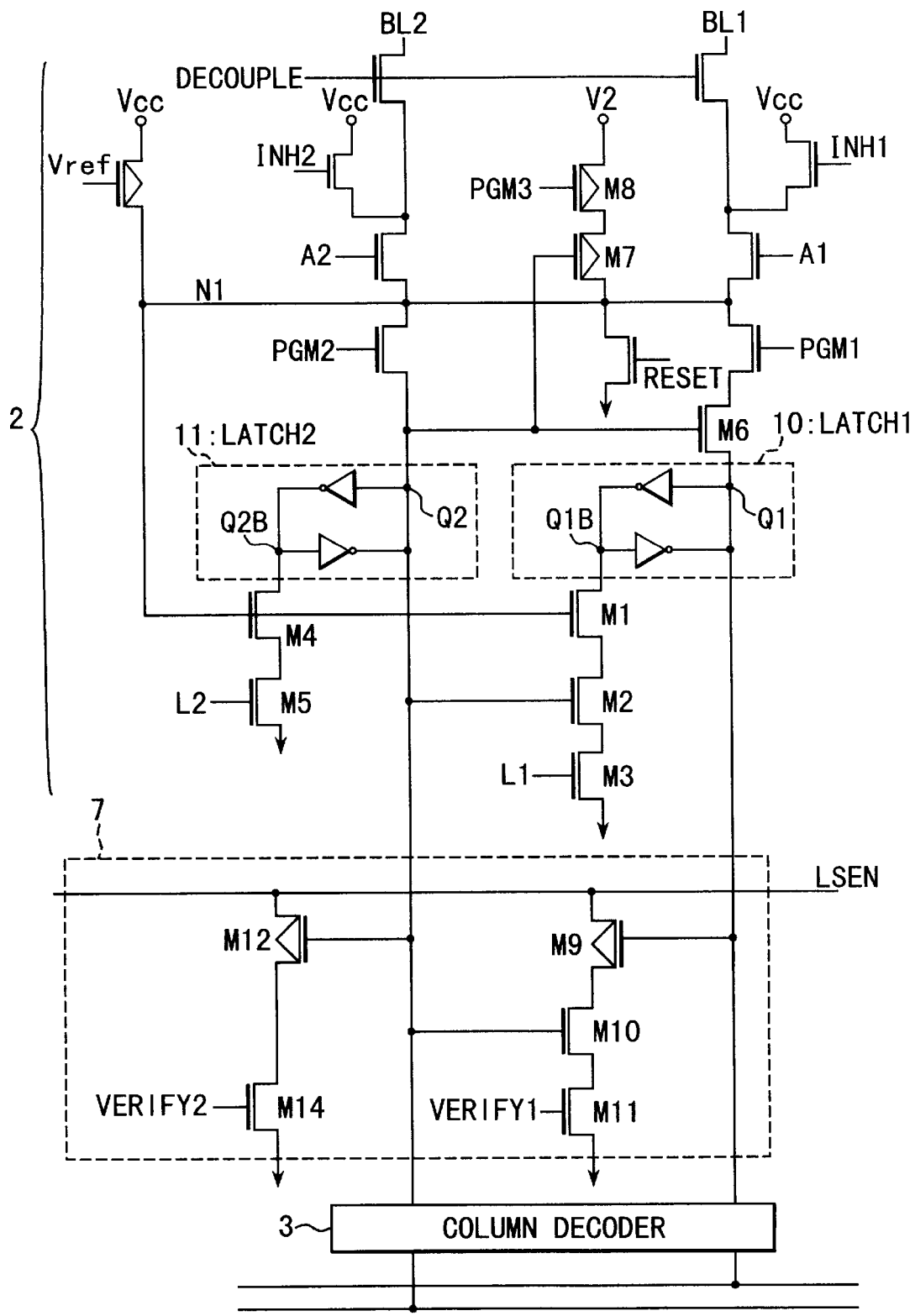
FIG. 6 is a diagram showing the circuit construction of a multi-level nonvolatile semiconductor memory device according to a first embodiment of this invention.

FIG. 6 shows the circuit construction of the sense/latch circuit 2, simultaneous verify detection circuit 7 and column decoder 3 in the four-level nonvolatile semiconductor memory device according to the first embodiment of this invention. The write operation and the verify operation are explained with reference to FIGS. 6, 7. A portion of the memory cell array 1 which is connected to BL1, BL2 as shown in FIG. 2 is omitted.

Figure 1:
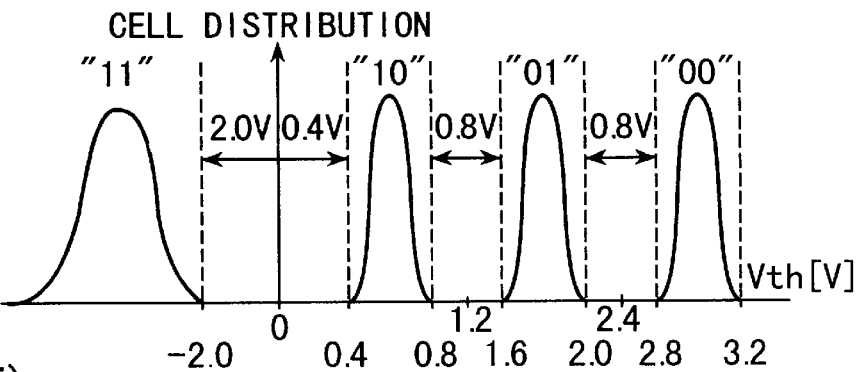
FIG. 1 is a diagram showing the threshold voltage distribution of four-level memory cells.

As shown in FIG. 7, in the write operation, write information according to the definition of FIG. 1 is supplied to LATCH1, LATCH2 as 2-bit data of (Q2, Q1), for example. The difference from the conventional case shown in FIG. 3 lies in the "10" program.

In the "10" program explained here, since the gate of a transistor M6 is applied with "L" of Q2 in the memory cell into which "00" or "01" data other than the target "10" data is written, M6 is turned OFF, the voltage of Q1 is not transferred to BL1, and instead, "L" of Q2 and "L" of PGM3 are respectively applied to the p-channel transistors M7 and M8. Therefore, M7, M8 are set in the ON state, the write inhibit voltage V2 of approx. 10V is applied to BL1 via M7, M8 to inhibit the write operation for a memory cell other than the memory cell into which the target "10" data is written.

The write and verify operations in the first embodiment are explained in more detail with reference FIG. 7. A1 is set to "H", A2 is set to "L", INH1 is set to "L", and INH2 is set to "H" as shown in the "10" program of FIG. 7 so as to inhibit the write operation into BL2. Further, when BL2 is selected, the circuit operation can be explained in the same manner simply by replacing A1 with A2 and INH1 with INH2.

Since Q2 is "H", M6 is turned ON and M7 is turned OFF because it is a p-channel transistor if PGM1 is "H", PGM2 is "L" and PGM3 is "L", and the write inhibit voltage V2 is cut OFF by M7 and "L" of Q1 is transferred to BL1. As shown by WL in FIG. 7, the write voltage 20V is applied for a preset period of time and the voltage of WL is returned to the "10" data verify voltage 0.4V, and then the program verify is effected. For example, the verify operation is effected by setting Vref to 0V and detecting whether or not the voltage precharged on the bit line is maintained.

If the threshold voltage of the memory cell exceeds 0.4V by the write voltage, the memory cell is set into the OFF state and the precharge voltage of the bit line is maintained. Since the precharge voltage is applied to M1 and "H" of Q2 is input to M2, Q1B is grounded via M1, M2, M3 by applying "H" of the read signal L1 to M3, and as a result, Q1 is inverted to "H" as shown by the arrow in FIG. 7. At this time, since Q2 of "00" data is "L", "L" of Q1 of "00" data is cut OFF by M2 and is not inverted to "H".

Figure 3:
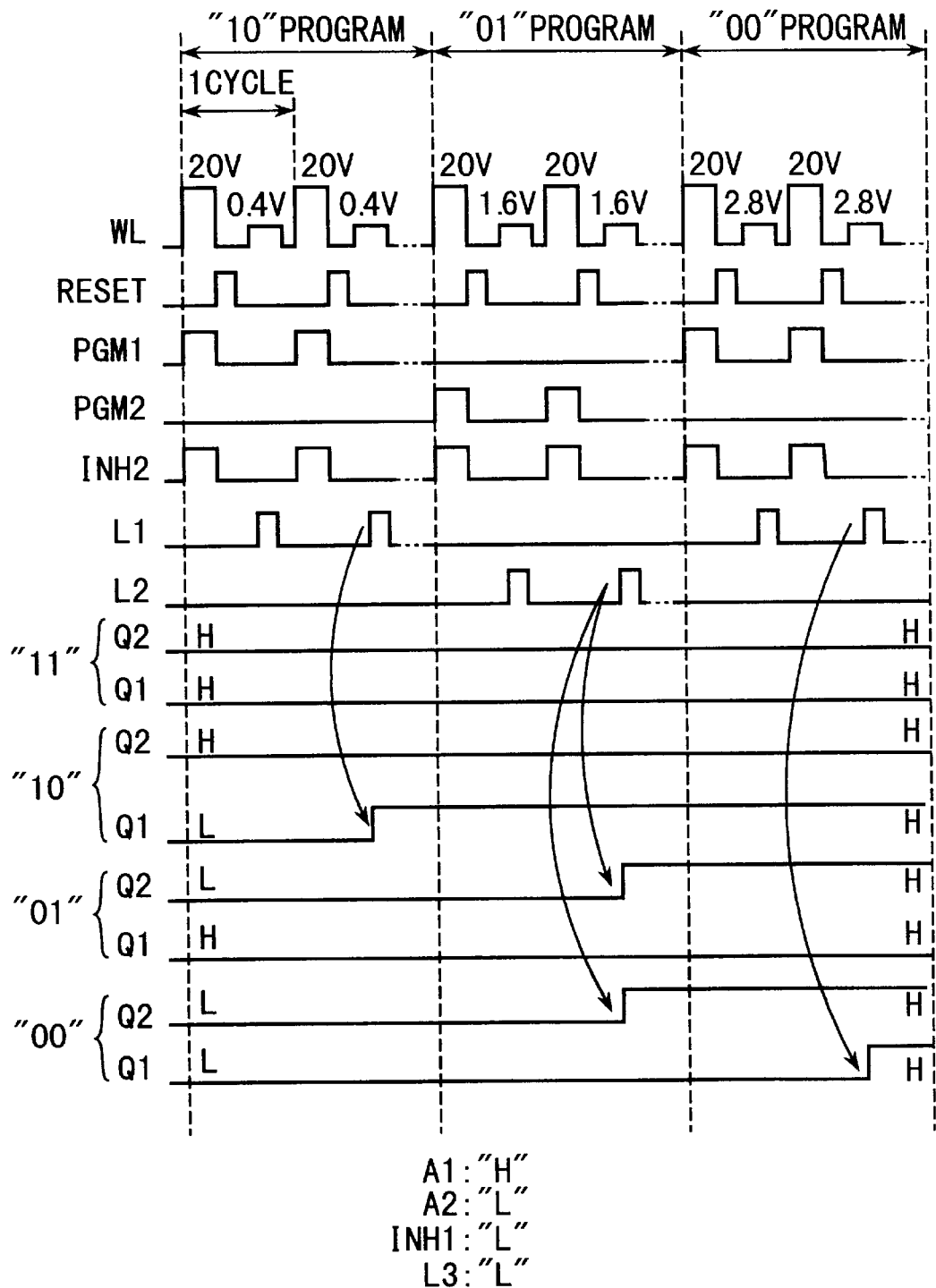
FIG. 3 is a timing diagram for illustrating the write and verify operations of the conventional multi-level nonvolatile semiconductor memory device.

In the conventional circuit explained with reference to FIGS. 2 and 3, since Q1 of "00" data is "L", the unwanted write operation is repeatedly effected for the memory cell in which "00" data is written in the "10" program, but in the circuit of the first embodiment shown in FIG. 6, since "L" of Q2 of "00", "01" data is applied to the gate of M6, M6 is turned OFF and the write operation is completely inhibited. However, in the conventional circuit, "01" data is set in the write inhibit state, and therefore, data for which the write operation is newly completely inhibited is "00" data which is unwantedly written in the prior art. As a result, the problem of over-program which may conventionally occur for "00" data can be solved.

The difference of the write inhibiting method from the conventional case is explained. The conventional write inhibit method shown in FIG. 2 is effected by setting the bit line voltage to Vcc and self-boosting the same. In the first embodiment of this invention, the write inhibit operation may be effected by setting V2 shown in FIG. 6 equal to Vcc, supplying the same to BL1 via M7, M8 and self-boosting the supplied voltage or by setting the "H" level of the sense amplifier at the write time and a voltage supplied from M7, M8 to approx. 8V and transferring the voltage directly to the channel of the memory cell without using the self-boosting method. In this embodiment, this is called a direct boosting method.

The result of verify is simultaneously fetched for one page into a single detection line LSEN by use of the simultaneous detection circuit 7 indicated by broken lines in FIG. 6. Prior to simultaneous detection, LSEN is precharged to Vcc. If the write state of "10" data in one page is sufficient, Q1 is inverted by the verify operation and both of Q1 and Q2 are set to "H", and the p-channel transistors M9 which is supplied with the above signal "H" are turned OFF, thereby maintaining the precharged voltage of LSEN even when M11 is turned ON with VERIFY1.

If a cell whose write state of "10" data is insufficient is present, Q1 is kept at "L" because it is not inverted by the verify operation and M9 is turned ON. At this time, since Q2 is "H", M10 is turned ON and the voltage precharged on LSEN is discharged via M9, M10, M11 by "H" of VERIFY1 input to M11.

Since Q1 of "01" data is "H" and M9 which is applied with the signal is turned OFF, "01" data has no relation with the simultaneous detection by VERIFY1, and since Q2 of "00" data is "L" and M10 is turned OFF, "00" data has no relation with the simultaneous detection by VERIFY1.

In a case where the high level of LSEN is maintained after the write operation for all of the memory cells into which "10" data is written is completed and the verify by use of VERIFY1 is completed in the same page, then it is determined that "10" data is just sufficiently written into all of the "10" write memory cells. As shown in the third column of TABLE 2 as "simultaneous detection", the write state of the memory cell for "11" data in which data is not to be written at this time is also simultaneously detected.

Next, after PGM3 is set to "H" in the "01" program and M8 is turned OFF to separate V2, "L" of Q2 of LATCH2 is transferred to BL1 via PGM2, A1 and the write voltage 20V is applied to WL of the memory cell for a preset period of time to effect the write operation for the memory cell into which "01" data is written. At this time, since "L" of Q2 of LATCH2 for "00" data is also transferred to BL1 via PGM2, A1, the write operation is also effected for the memory cell into which "00" data is written. After this, the voltage of WL is returned to the verify voltage 1.6V for "01" data and then the verify operation is effected.

If the threshold voltage exceeds 1.6V, the precharge voltage is maintained, Q2B is grounded via M4 applied with the above voltage and M5 applied with the read signal L2, and as shown by the arrow in FIG. 7, Q2 of "01" data is inverted to "H". At this time, if the threshold voltage of the memory cell into which "00" data is written exceeds 1.6V, Q2 of "00" data is also inverted to "H" as indicated by the arrow.

However, it should be noted a memory cell whose threshold voltage does not reach 1.6V and in which Q2 of "00" data is not inverted to "H" even when the threshold voltages of all of the memory cells into which "01" data is written exceed 1.6V if the verify detection circuit is constructed by paying an attention only to the "01" write state at the time of "01" write verify may be included in the memory cells into which "00" data is written.

In the first embodiment, as shown in FIG. 7, the condition that the nodes Q2 of all of the "01" data and "00" data are inverted to "H" in the "01" program must be satisfied to shift the operation to the next "00" program.

For this reason, the detection circuit 7 including LSEN must be constructed so as not to detect completion of the write operation of "01" program until the threshold voltages of all of the memory cells into which "01" data and "00" data are written exceed 1.6V at the time of verify as shown by two arrows in the "01" program of FIG. 7.

The simultaneous detection in the "01" program is effected as follows. LSEN is precharged to Vcc before simultaneous detection, but at this time, Q2 is inverted to "H" and the p-channel transistor M12 which is applied with the above voltage is turned OFF. Therefore, the precharge voltage of LSEN is maintained even when M14 is turned ON by VERIFY2.

If a cell in which "01" data is insufficiently written is present in the page, Q2 is kept at "L" and M12 is turned ON, and if M14 is turned ON by VERIFY2, LSEN is grounded via M12, M14 and the precharge voltage of LSEN is discharged. Further, if a memory cell whose threshold voltage does not reach 1.6 is included in the memory cells into which "00" data is written, Q2 thereof is kept at "L" and the precharge voltage of LSEN is discharged via M12, M14.

Therefore, in the simultaneous detection circuit 7 of FIG. 6, the precharge voltage of LSEN is not discharged and completion of the "01" data write operation is detected when the threshold voltages of all of the memory cells into which "01" data and "00" data are written exceed 1.6V at the "01" verify time.

Thus, whether or not data is just sufficiently written into all of the memory cells into which "01" data is written can be simultaneously detected. Further, as indicated by "simultaneous detection" in the fourth column of TABLE 2, the write state of "10" data and "11" data into the memory cells can also be simultaneously detected.

Thus, in the "01" program, "00" data is also written, but if the threshold voltage of the memory cell into which "00" data is written exceeds 1.6V, Q2 is inverted to "H" and the succeeding write operation is inhibited, and therefore, the threshold voltage does not exceed 2.0V of FIG. 2 and over-program of "00" data will not occur.

Finally, in the "00" program, after PGM3 is set to "H" to turn OFF M8 and separate V2, the write operation is effected, and if the threshold voltage exceeds the verify voltage 2.8V of "00" data, M1 applied with the precharge voltage and M3 applied with the read signal L1 are turned ON and Q2 of "00" data is set to "H" in the previous "01" program, and therefore, Q1B is grounded via M1, M2, M3 and Q1 of "00" data is inverted to "H" as shown in FIG. 7.

In the simultaneous detection of "00" program, the verify simultaneous detection can be effected in the same manner as in the "10" program simply by using VERIFY1 and setting the verify voltage to 2.8V since the Q2 is set to "H" in the previous "01" program. As indicated by "simultaneous detection" in the final column of TABLE 2, the write state of "01", "10" and "11" data into the memory cells can also be simultaneously detected.

The state change of the latch in the write and verify operations in the first embodiment described above is shown in TABLE 2.

TABLE 2

| WRITE DATA | DATA IN LATCHES | | AFTER "10" PROGRAM | | AFTER "01" PROGRAM | | AFTER "00" PROGRAM | |
|---|---|---|---|---|---|---|---|---|
| | Q1 | Q2 | Q1 | Q2 | Q1 | Q2 | Q1 | Q2 |
| 00 | L | L | L | L | L | (H) | (H) | H |
| 01 | H | L | H | L | H | H | H | H |
| 10 | L | H | (H) | H | H | H | H | H |
| 11 | H | H | (H) | H | (H) | H | (H) | H |

SIMULTANEOUS DETECTION ↑ ↑ ↑

Thus, after the operations for the "10", "01" and "00" programs are effected, all of Q1 and Q2 which give four-level data are inverted to "H" and it is ensured that neither the insufficient write nor the over-program occur in four-level information written into the memory cells.

Figure 8:
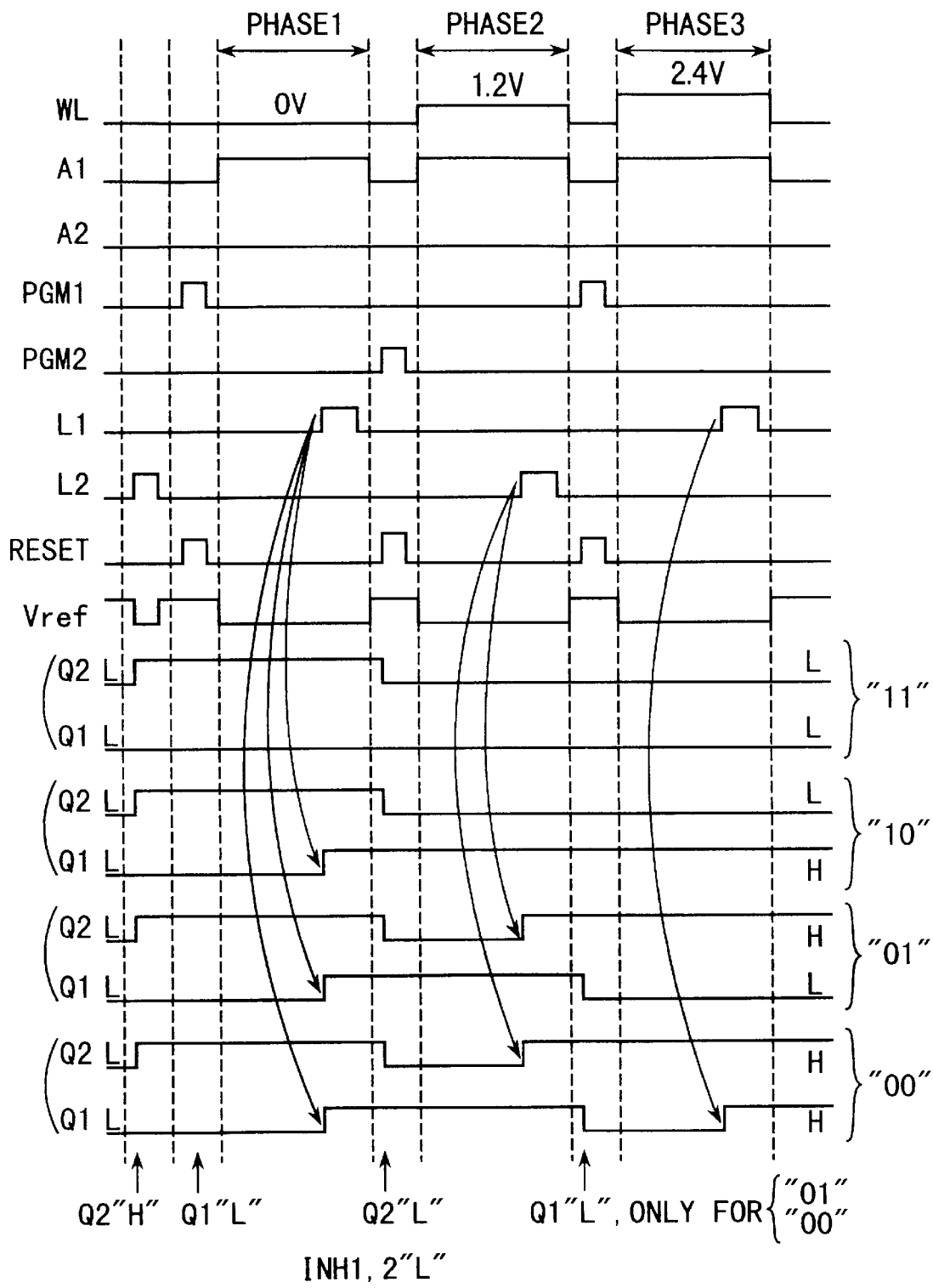
FIG. 8 is a timing diagram for illustrating the read operation of the multi-level nonvolatile semiconductor memory device according to the first embodiment of this invention.

Next, the readout operation in the first embodiment is explained with reference to FIG. 8. Data readout to LATCH1, LATCH2 is separately effected in three divided phases as shown in FIG. 8. The readout operation of this embodiment is characterized in that the voltages are applied to the word line in an order of 0V, 1.2V and 2.4V which is the reverse order in the case of the conventional readout operation as explained with reference to FIG. 4, the transistors M19, M20 of FIG. 2 which are conventionally required for readout are omitted, and M2, M3 which are conventionally used only for writing are also used for readout.

In the readout operation of the first embodiment, it is necessary to set the levels of Q1, Q2 to preset levels prior to the operation of each of the phases. That is, as indicated by short arrows in FIG. 8, Q2 is set to "H" and Q1 is set to "L" before phase1, Q2 is set to "L" before phase2 and Q1 only for "01" and "00" is set to "L" before phase3. INH1, INH2 are both set to "L" to separate Vcc from the bit line.

Next, the readout operation is explained in detail with reference to the timing diagram of FIG. 8. Prior to the readout operation, the nodes Q1, Q2 may be set at any state, but in this example, all of the nodes Q1 and Q2 are set at "L". Prior to the phase1, Vref is set to "L" and a p-channel transistor which is supplied with Vref is turned ON and Vcc is applied to the gate of M4 to turn ON the same. If the read signal L2 is "H", Q2B is grounded via M4, M5 and all of the nodes Q2 are set to "H".

If L2 is set to "L" and Vref is inverted to "H" to separate Vcc and PGM1 is set to "H" and RESET is set to "H" to turn ON the respective transistors, Q1 is grounded via transistors of M6, PGM1, RESET since the gate of M6 is applied with "H" of Q2 which is previously set, and as a result, all of the nodes Q1 are set to "L".

In the phase1, the bit line is precharged and then WL is set to 0V. If the threshold voltages of the memory cells are equal to or higher than 0V, that is, if they are included in the distribution of "10", "01", "00" shown in FIG. 1, the memory cells are set into the OFF state and the bit line voltage is maintained, but the memory cell in the distribution "11", that is, the memory cell for which the write operation is not effected is set into the ON state and the bit line is discharged. If A1 is set to "H" to address BL1 and the read signal L1 is set to "H", the bit line voltage is applied to M1, and since M2 is applied with "H" of Q2 and is turned ON, Q1B of the memory cell in which "10", "01" or "00" is written is grounded via M1, M2, M3 and Q1 is inverted to "H" as indicated by three arrows of FIG. 8.

If A1 is set to "L" to turn OFF the address transistor, PGM2, RESET are set to "H" and Vref is set to "H" to separate Vcc prior to the phase2, Q2 is grounded via the transistors of PGM2, RESET and each of the nodes Q2 is inverted to "L".

In the phase2, WL is set to 1.2V and the nodes Q2 of "01" and "00" data are inverted to "H". The voltage of the precharged bit line is applied to M4 and if the read signal L2 is "H", Q2B is grounded via M4, M5, and the nodes Q2 of "01" and "00" data are respectively inverted as indicated by two arrows of FIG. 8.

Prior to the phase3, if A1 is set to "L" to turn OFF the address transistor, PGM1, RESET are set to "H" and Vref is set to "H" to separate Vcc, "H" of Q2 is applied to M6 since Q2 of "01", "00" data is inverted to "H" in the phase2, and Q1 of "01", "00" data is grounded via M6, PGM1, RESET and is set to "L".

In the pahse3, WL is set to 2.4V and Q1 of "00" data is inverted to "H". The voltage of the precharged bit line is applied to M1, the transistor M2 is turned ON since Q2 of "00" data is inverted to "H" in the phase2, and if the read signal L1 is "H", the node Q1B is grounded via M1, M2, M3 and the node Q1 of "00" data is inverted to "H".

The voltages of the nodes (Q2, Q1) after the three read phases described above become (L, L), (L, H), (H, L), (H, H) when the state of the selected cell is set to "11", "10", "01", "00" as indicated in the right end portion of FIG. 8.

As described above, in the read operation of this embodiment, it is necessary to set the states of LATCH1, LATCH2 before each of the read phases. Time required for the setting is extremely short in comparison with time (read time to the latch) required for the operation of each of the phases and the influence thereof on the entire readout time can be neglected. For example, time for reading data to the latch is 22 μsec, but an increment in the readout time is at most approx. 400 nsec in this embodiment.

Further, in a case where the read operation is effected in a pipeline fashion in the inter-page continuous access mode wherein the page which is the unit of write is divided into front and latter halves at the readout time, the serial read operation for transferring data fetched into the sense/latch circuit for the front-half page to the I/O pin during the random read operation for fetching data into the sense/latch circuit for the latter-half page from the memory cell is effected, and then the random read operation with respect to the sense/latch circuit for the front-half page in the next cycle is effected during the serial read operation for transferring data fetched into the sense/latch circuit for the later-half page to the I/O pin, time required for the serial read operation is generally longer than time required for the random read operation and an increase in time for the random read operation does not cause any problem except the random read operation with respect to the sense/latch circuit for the front-half page in the first cycle.

Figure 9:
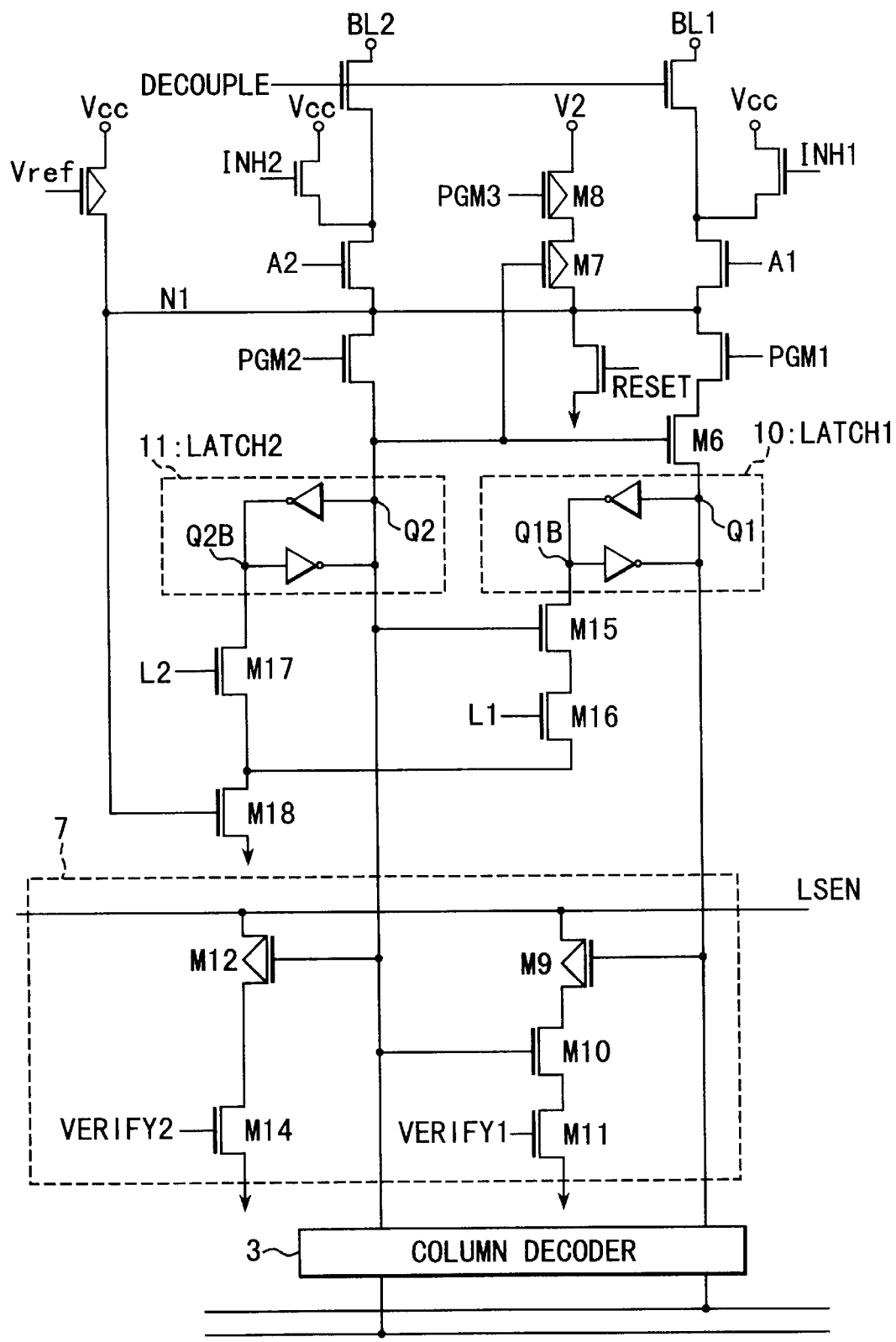
FIG. 9 is a diagram showing the circuit construction of a multi-level nonvolatile semiconductor memory device according to a second embodiment of this invention.

Next, a second embodiment of this invention is explained with reference to FIG. 9. This embodiment is different from the first embodiment in that transistors M15 to M18 of FIG. 9 are used instead of the transistors M1 to M5 of FIG. 6.

The write and verify operations in the second embodiment are explained with reference to the timing diagram of FIG. 7. In the write operation, M15 to M18 are not related and the write operation is effected in exactly the same manner.

The verify of "10" program is effected as follows. Prior to the "10" program the bit line is precharged by setting Vref to 0V. If the threshold voltage of the memory cell exceeds 0.4V by the write voltage, the memory cell is set into the OFF state and the precharge voltage of the bit line is maintained. Since the precharge voltage is applied to M18 and "H" of Q2 is applied to M15, Q1 is inverted to "H" by applying a read signal L1 to M16. "L" of Q1 of "00" data is cut off by M15 since Q2 is "L" and is not inverted to "H". At this time, the unwanted write operation of "00" data is inhibited by M6 since Q2 of "00" data is "L".

Since the circuit construction of the simultaneous detection circuit 7 is the same as that of the first embodiment, the write states of the memory cells of "10" and "11" data in the "10" program can be simultaneously detected for each page in exactly the same manner as in the first embodiment as shown in TABLE 2.

The verify of "01" program is effected as follows. If the threshold voltage of the memory cell exceeds 1.6V by the write voltage, the precharge voltage is maintained and Q2 of "01" data is inverted to "H" by M18 applied with the precharge voltage and M17 applied with the read signal L2. At this time, Q2 of "00" data is also inverted to "H". However, over-program does not occur in the memory cell into which "00" data is written. Like the first embodiment, the write states of "01", "10", "11" data into the memory cells in the "01" program are simultaneously detected for each page as shown in TABLE 2.

The verify of "00" program is effected as follows. If the threshold voltage of the memory cell exceeds 2.8V by the write voltage, M18 applied with the precharge voltage and M16 applied with the read signal L1 are turned ON, and since Q2 of "00" data is "H", Q1 of "00" data is inverted to "H". Like the first embodiment, the write states of "00", "01", "10", "11" data into the memory cells in the "00" program are simultaneously detected for each page as shown in TABLE 2.

As described above, it is understood that the roles of M1, M2, M3 in the first embodiment can be replaced by the roles of M18, M15, M16 in the second embodiment and the roles of M4, M5 in the first embodiment can be replaced by the roles of M18, M17 in the second embodiment. Therefore, the readout operation can also be effected in exactly the same manner as in the first embodiment by use of M15 to M18.

It should be noted that the number of elements used in the second embodiment is less than the number of elements used in the first embodiment by one. The number of elements used in the first embodiment is larger by one than the number of elements used in the conventional circuit explained with reference to FIG. 2, and therefore, the number of elements used in the second embodiment can be made equal to that of the conventional circuit. Further, since the conventional transistors M19, M20 which are omitted in the first and second embodiments have a role of inverting the latch, they are formed of transistors having large gate width. Therefore, the great advantage in view of the layout can be attained by omitting the transistors in the first and second embodiments.

Figure 10:
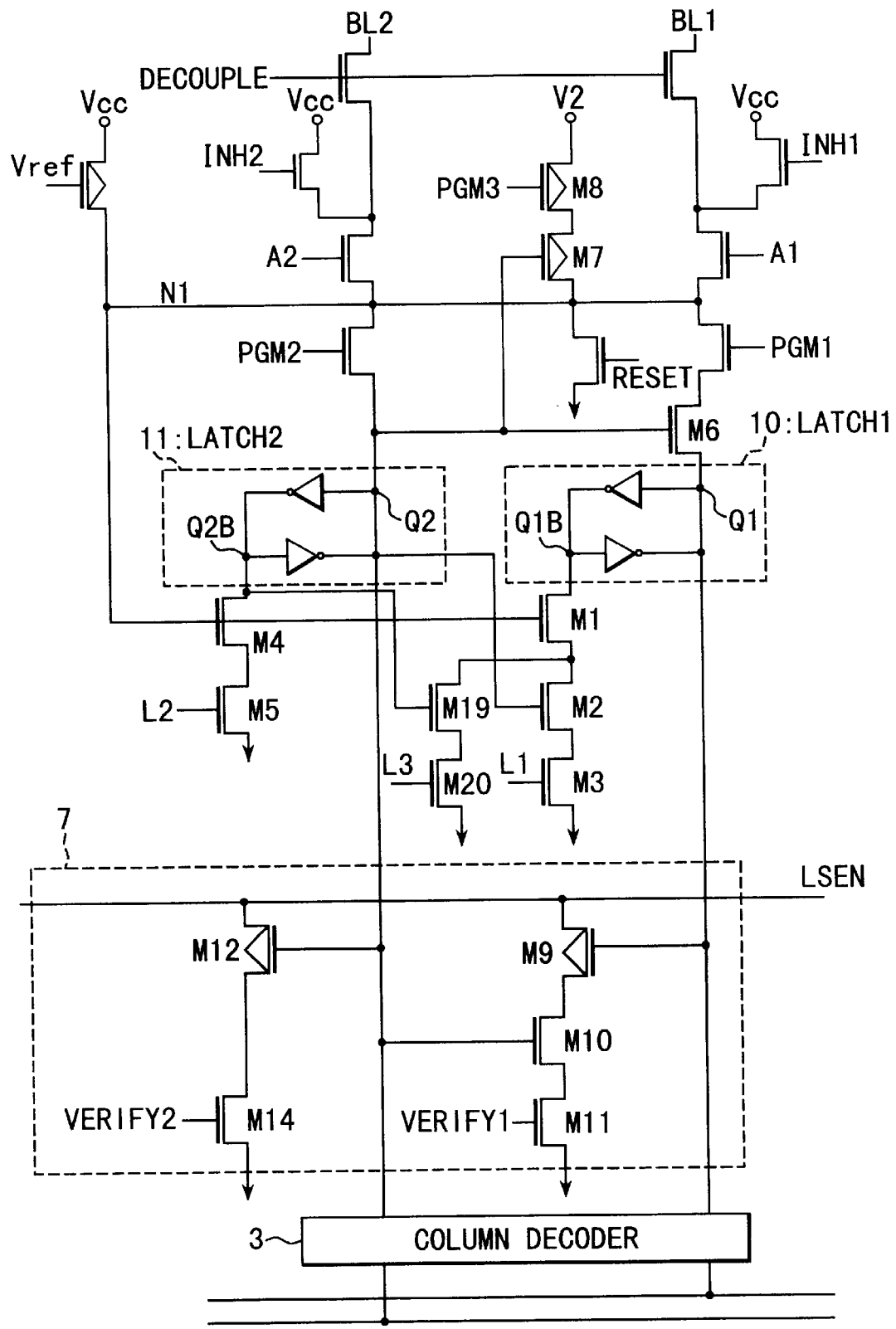
FIG. 10 is a diagram showing the circuit construction of a multi-level nonvolatile semiconductor memory device according to a third embodiment of this invention.

Next, a third embodiment of this invention is explained with reference to FIG. 10. In a case where the layout area of sense/latch circuits is sufficiently large or where it is desired to suppress an increase in the readout time and prevent a clock system from being complicated by using the readout method of the first and second embodiments, the circuit construction used for the verify and readout operations may be constructed to include M1 to M5 and M19, M20 as shown in FIG. 10 like the conventional circuit construction of FIG. 2. With this construction, in the write and verify operations, over-program into the memory cell into which "00", data is written can be prevented, and in the readout operation, a simple readout operation which is the same as that shown in FIG. 4 can be attained.

Next, a fourth embodiment of this invention is explained with reference to FIG. 11.

Figure 11:
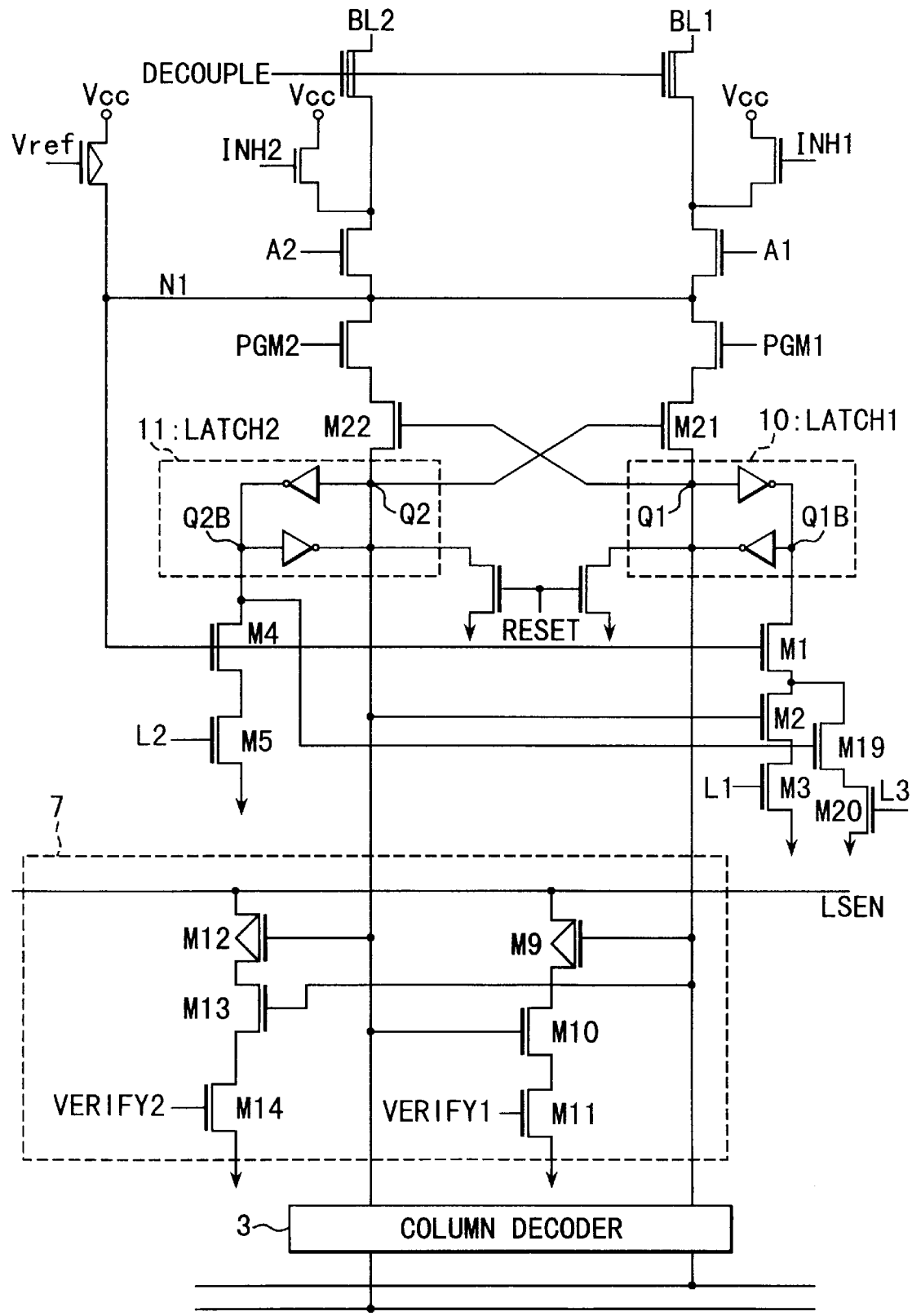
FIG. 11 is a diagram showing the circuit construction of a multi-level nonvolatile semiconductor memory device according to a fourth embodiment of this invention.

The operation of temporarily storing four-level data to be stored into the memory cell as bit data of two bits into LATCH1, LATCH2 surrounded by broken lines as shown in FIG. 11 and selecting the bit line by use of address signals A1, A2 is the same as that explained before.

The present embodiment is different from the first to third embodiments in that a transfer control transistor M22 for controlling transfer of upper bit data held in LATCH2 to the bit line by use of lower bit data held in LATCH1 and a transfer control transistor M21 for controlling transfer of lower bit data held in LATCH1 to the bit line by use of upper bit data held in LATCH2 are provided and used to completely prevent occurrence of a conventional problem, that is, over-program into the memory cell into which "00" data is written.

The write and verify operations of the fourth embodiment is explained in detail with reference to the timing diagram shown in FIG. 12.

Prior to the write operation, bit data of two bits used for write is input as voltages of (Q2, Q1) to the sense/latch circuit as shown in FIG. 12. As described in the first embodiment, write bit data is input such that "00" is Q1: L, Q2: L, "01" is Q1: Hf Q2: L, "10" is Q1: L, Q2: H, and "11" is Q1: H, Q2: H.

First, "10" data is written into the memory cell by use of "L" of Q1 among the states of Q1, Q2 giving data "10" in the "10" program. The bit line BL1 connected to the memory cell subjected to the write operation is selected by setting A1 to "H", setting A2 to "L" and setting INH1 to "L". Further, the P-channel transistor which is supplied by Vref is turned ON, and at least node one (Ni) is precharged. Before transmitting "L" of Q1 to BL1, INH2 is set to "H" to prevent the write operation into BL2. If PGM1 is set to "H" and PGM2 is set to "L", then M21 is turned ON since Q2 is "H", and "L" of Q1 in the "10" data is transferred to the bit line BL1 via the transistors M21, PGM1 and A1.

At this time, since Q2 of "00" data is "L", M21 is turned OFF and transfer of "L" of Q1 of "00" data to BL1 is inhibited. Since Q1 of "01" data is "H", "L" of Q1 is transferred to BL1 to set BL1 to 0V only when "10" data is written. At this time, if the word line is set to the write voltage of approx. 20V for a preset period of time, the write operation is effected only for the memory cell into which "10" data is written. Thus, a conventional problem of the unwanted write operation for writing "00" data into the memory cell when the target "10" data is written can be completely prevented.

The verify operation in the "10" program can be effected in the same manner as that explained with reference to FIG. 3 and the explanation therefor is omitted. The result of verify is simultaneously fetched for one page into a single detection line LSEN by use of a simultaneous detection circuit 7 indicated by broken lines in FIG. 11. Prior to simultaneous detection, LSEN is precharged to Vcc. In this case, since Q1 is inverted in the verify operation if the write state of "10" data in one page is sufficient, Q1, Q2 are both set to "H", and p-channel transistors M9 which is respectively supplied with the above potential is turned OFF, and even when M11 is turned ON with VERIFY1 the precharged voltage of LSEN is maintained.

If a cell whose write state of "10" data is insufficient is present, Q1 is not inverted in the verify operation and is kept at "L", and M9 is turned ON. At this time, since Q2 is "H", M10 is turned ON and the precharged voltage of LSEN is discharged via M9, M10, M11 by "H" of VERIFY1 input to M11. Since Q1 of "01" data is "H", M9 applied with the potential is turned OFF, and since Q2 of "00" data is "L", then M10 is turned OFF and therefore no influence is given by simultaneous detection by use of VERIFY1.

If the high level of LSEN is maintained after the write operation for all of the memory cells into which "10" data is written in the same page is completed and the verify is effected by use of VERIFY1, it is determined that "10" data is just sufficiently written into all of the memory cells in which "10" data is written. As indicated by "simultaneous detection" in the third column of TABLE 3, the write state of "11" data into the memory cells into which data is not to be written is also simultaneously detected.

Next, the operation of writing "01" data into the memory cell is explained. Since Q1 is "H", M22 is turned ON, "L" of Q2 of "01" data is transferred to BL1 via the transistors M22, PGM2, A1 by setting A1, PGM2 to "H", and then a voltage of approx. 20V is applied to WL for a preset period of time to effect the write operation. After the write operation, the verify for "01" data is effected.

The "01" verify is effected by setting the word line voltage at 1.6V. If the write operation is normal, the pre- charge voltage of the bit line is maintained without being discharged. The bit line voltage is applied to M4, and since Q1B is grounded via M4, M5 by setting the read signal L2 to "H" if the write operation is normal, Q2 is inverted to the write inhibit state "H" as indicated by an arrow in the "01" program of FIG. 12.

At this time, the write operation is effected for the memory cell into which "00" data is written until Q2 is inverted in the "01" program in the first embodiment, but the threshold voltage does not exceed 2.0V and there is no possibility that over-program will occur. In the "01" program of the fourth embodiment, since Q1 of "00" data is "L", M22 applied with this potential is turned OFF and "L" of Q2 of "00" data is not transferred to BL1. Therefore, in this embodiment, as shown in FIG. 12, only Q2 of "01" data is inverted by the read signal L2 and the write operation is not effected at all for the memory cell into which "00" data is written even in the "01" program.

The simultaneous detection of the "01" program is effected as follows. Prior to the simultaneous detection, LSEN is precharged to Vcc, but since Q2 is inverted to "H", the p-channel transistor M12 applied with this potential is turned OFF. Therefore, the precharge potential of LSEN can be maintained even if M14 is turned ON by VERIFY2.

Since Q2 is kept at "L" if a cell whose write state of "01" data is insufficient is present in the page, M12 is turned ON, and since Q1 is "H", M13 is turned ON, and as a result, if M14 is turned ON by VERIFY2, LSEN is grounded via M12, M13, M14 and the precharge voltage of the LSEN line is discharged. Since Q1 of "00" data is "L", M13 is turned OFF and no influence is given by the simultaneous detection by VERIFY2. Thus, whether or not data is just sufficiently written into all of the memory cells into which "01" data is written can be simultaneously detected. As indicated by "simultaneous detection" in the fourth column of TABLE 3, the write states of "10", "11" data are also simultaneously detected.

Next, the "00" write operation is explained. Prior to the "00" program, Q1 of "00" data is changed to the write state as indicated by the arrow in FIG. 12 and TABLE 3. That is, after the bit line is precharged by setting Vref to 0V and turning ON the p-channel transistor supplied by Vref at the write time, the read signal L3 is set to "H". Since Q2B is "H", M19 is turned ON and Q1B is grounded via M1, M19, M20. Thus, if Q1 is forcedly inverted to the write state "H" by the read signal L3 before the "00" program is started, the "00" data write and verify operations can be effected in exactly the same manner as in the case of "01" program simply by setting the verify voltage at 2.8V.

That is, if the lower bit of "00" data is forcedly inverted to "1" by using the read signal L3 (corresponding to an external signal of claim 10) at the start time of "00" program during the precharged state of node one, which is obtained by setting Vref to 0V, the number of written states fetched into the latch can be reduced by one and the write and verify operations for "00" data can be effected in the same manner as in the case of the "01" operation, and therefore, the circuit construction necessary for the write operation can be simplified.

In the simultaneous detection of "00" program, Q1 is previously forcedly inverted to "H" by use of the read signal L3 and the simultaneous verify can be effected in the same manner as in the case of "01" program simply by using VERIFY2 again and setting the verify voltage at 2.8V.

The changes in the states of the latch in the write and verify operations in the fourth embodiment are shown in TABLE 3.

TABLE 3

| WRITE DATA | DATA IN LATCHES | | AFTER "10" PROGRAM | | AFTER "01" PROGRAM | | AT START OF "00" PROGRAM | | AFTER "00" PROGRAM | |
|---|---|---|---|---|---|---|---|---|---|---|
| | Q1 | Q2 | Q1 | Q2 | Q1 | Q2 | Q1 | Q2 | Q1 | Q2 |
| 00 | L | L | L | L | L | L | H | L | H | H |
| 01 | H | L | H | L | H | H | H | H | H | H |
| 10 | L | H | H | H | H | H | H | H | H | H |
| 11 | H | H | H | H | H | H | H | H | H | H |

SIMULTANEOUS DETECTION

As indicated by "simultaneous detection" in the final column of TABLE 3, the write states of "01", "10", "11" data into the memory cells are also simultaneously detected.

Thus, all of the nodes Q1, Q2 giving four-level data are inverted to "H" after the operations of "10", "01", "00" programs are effected and it is ensured that insufficient write and over-program will not occur in four-level information written into the memory cells.

Figure 4:
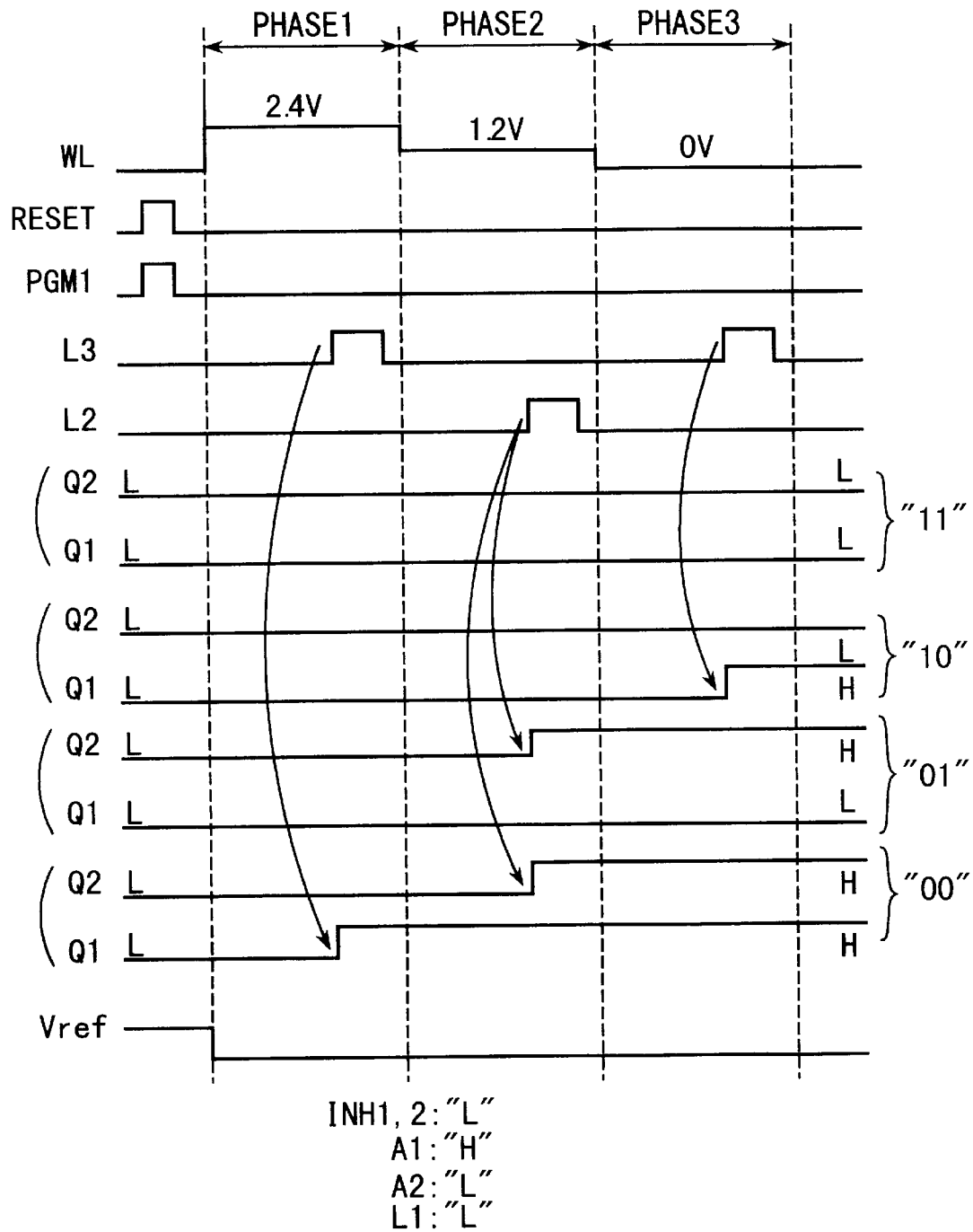
FIG. 4 is a timing diagram for illustrating the read operation of the conventional multi-level nonvolatile semiconductor memory device.

The readout operation of the fourth embodiment can be effected in the same manner as in the case of FIG. 4 since the circuit construction of M1 to M5 and M19, M20 is the same as that of FIG. 2 and the explanation therefor is omitted.

This invention is not limited to the above embodiments. In the fourth embodiment, in the final phase of the write and verify program, a case wherein the lower bit of "00" data is inverted is explained, but if the circuit construction connected to LSEN is slightly modified, the same operation can be effected in another phase.

Further, if the portions of the readout circuits each constructed by M1 to M5 and M15 to M20 described in the first to fourth embodiments are slightly modified, they can be interchangeably used in the other embodiment.

In the above explanation, a case wherein fourlevel information is given by 2-bit data is explained, but if the configurations of the above embodiments are developed, the write, verify and readout operations for multi-level information other than four-level information can be easily attained. Further, this invention can be modified without departing from the technical scope thereof.

As described above, in the multi-level nonvolatile semiconductor memory device of this invention, since a plurality of bits can be written while the write states thereof are verified, the levels of the write data can be precisely controlled without causing the threshold voltage after the write operation for the memory cell to become excessively high or low. Further, since the result of verify can be simultaneously detected for each page, time can be significantly reduced.

Normally, a large number of transistors are required to transfer a plurality of write data items to the bit line by use of the latch circuits which make a pair, but in this invention, an increase in the number of control transistors can be suppressed to minimum by forcedly setting the state "00" to "01" by use of a simple bit inversion circuit after the write operation of "01", is completed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A multi-level nonvolatile semiconductor memory device comprising:
    a memory cell array having a plurality of rewritable memory cells for storing multi-level information arranged in a matrix form;
    a signal line for transferring a signal with respect to said memory cell array; and
    a plurality of sense/latch circuits in which write data items to be simultaneously written into a plurality of memory cells of said memory cell array are latched;
    wherein each of said sense/latch circuits includes a plurality of latch circuits, each of said plurality of latch circuits is connected to the signal line via at least one control circuit, and there is provided a write phase in which the voltage level of one of nodes of the latch circuit which is a connection node of one of said plurality of latch circuits and the control circuit is inhibited from being transferred to the signal line when the voltage level of one of nodes of a different latch circuit which is a connection node of the different latch circuit and the control circuit is set at a low level.

2. A multi-level nonvolatile semiconductor memory device comprising:
    a memory cell array having a plurality of rewritable memory cells for storing multi-level information arranged in a matrix form;
    a signal line for transferring a signal with respect to said memory cell array; and
    a plurality of sense/latch circuits in which write data items to be simultaneously written into a plurality of memory cells of said memory cell array are latched;
    wherein each of said sense/latch circuits includes first and second latch circuits, one of nodes of said first latch circuit is connected to one of terminals of a first serially connected control circuit, one of nodes of said second latch circuit is connected to one of terminals of a second serially connected control circuit, the other terminals of said first and second serially connected control circuits are connected to said signal line, a node one for mutually connecting the other terminals of said first and second serially connected control circuits is connected to a voltage terminal for supplying a write inhibit voltage to said signal line via a third serially connected control circuit, and there is provided a write phase in which the write inhibit voltage is supplied from said voltage terminal when said one of the nodes of said first latch circuit and said one of the nodes of said second latch circuit are both set at a low level.

3. A multi-level nonvolatile semiconductor memory device according to claim 2, wherein said one of the nodes of said first latch circuit is connected to said node one via first and second transistors, said one of the nodes of said second latch circuit is connected to said node one via a third transistor, said voltage terminal is connected to said node one via fourth and fifth transistors, a gate of said second transistor is connected to said one of the nodes of said second latch circuit, a gate of said fifth transistor is connected to said one of the nodes of said second latch circuit, and gates of said first, third and fourth transistors are supplied with first, second and third program signals.

4. A multi-level nonvolatile semiconductor memory device according to claim 3, wherein said second transistor is turned OFF and said fifth transistor is turned ON when said one of the nodes of said second latch circuit is set at a low level, and the write inhibit voltage is supplied from said voltage terminal to said node one via said fourth and fifth transistors by inputting the third program signal.

5. A multi-level nonvolatile semiconductor memory device according to claim 3, which further comprises sixth, seventh and eighth transistors serially connected between an inverted node of said first latch circuit and a preset voltage terminal, and ninth and tenth transistors serially connected between an inverted node of said second latch circuit and a preset voltage terminal and in which gates of said sixth and ninth transistors are connected to said node one, a gate of said seventh transistor is connected to said one of the nodes of said second latch circuit, and gates of said eighth and tenth transistors are supplied with first and second read signals.

6. A multi-level nonvolatile semiconductor memory device according to claim 3, which further comprises eleventh and twelfth transistors serially connected between an inverted node of said second latch circuit and a preset voltage terminal, and thirteenth and fourteenth transistors serially connected between an inverted node of said first latch circuit and a connection node of said eleventh and twelfth transistors and in which a gate of said twelfth transistor is connected to said node one, a gate of said thirteenth transistor is connected to said one of the nodes of said second latch circuit, a gate of said fourteenth transistor is supplied with a first read signal, and a gate of said eleventh transistor is supplied with a second read signal.

7. A multi-level nonvolatile semiconductor memory device according to claim 3, which further comprises fifteenth, sixteenth and seventeenth transistors serially connected between an inverted node of said first latch circuit and a preset voltage terminal, eighteenth and nineteenth transistors serially connected between a connection node of said fifteenth and sixteenth transistors and a preset voltage terminal, and twentieth and twenty-first transistors serially connected between an inverted node of said second latch circuit and a preset voltage terminal and in which gates of said fifteenth and twentieth transistors are connected to said node one, a gate of said sixteenth transistor is connected to said one of the nodes of said second latch circuit, a gate of said eighteenth transistor is connected to said inverted node of said second latch circuit, said seventeenth transistor is supplied with a first read signal, said twenty-first transistor is supplied with a second read signal, and said nineteenth transistor is supplied with a third read signal.

8. A multi-level nonvolatile semiconductor memory device comprising:
a memory cell array having a plurality of rewritable memory cells for storing multi-level information arranged in a matrix form;
a signal line for transferring a signal with respect to said memory cell array; and
a plurality of sense/latch circuits in which write data items to be simultaneously written into a plurality of memory cells of said memory cell array are latched, each of said sense/latch circuits including a first latch circuit for holding lower bit data and a second latch circuit for holding upper bit data;
a first transfer control circuit for controlling transfer of the lower bit data held in said first latch circuit to said signal line according to the upper bit data held in said second latch circuit; and
a second transfer control circuit for controlling transfer of the upper bit data held in said second latch circuit to said signal line according to the lower bit data held in said first latch circuit;
wherein the write operations of multi-level information into said memory cells according to the upper bit data and lower bit data are effected in different write phases.

9. A multi-level nonvolatile semiconductor memory device according to claim 8, wherein said first and second transfer control circuits respectively include a first transistor serially connected between said signal line and one of nodes of said first latch circuit and a second transistor serially connected between said signal line and one of nodes of said second latch circuit, a gate of said first transistor is connected to said one of the nodes of said second latch circuit, and a gate of said second transistor is connected to said one of the nodes of said first latch circuit.

10. A multi-level nonvolatile semiconductor memory device according to claim 8, further comprising an inverting circuit for forcedly inverting bit data held in one of said first and second latch circuits by use of an external signal in a specified write phase.

11. A multi-level nonvolatile semiconductor memory device according to claim 10, wherein there is provided a write phase in which a low level of said one of nodes of one of said first and second latch circuits is transferred to said signal line to set said signal line into a write enable state when only one of said one of the nodes of said first latch circuit and said one of the nodes of said second latch circuit is set at a low level.

12. A multi-level nonvolatile semiconductor memory device according to claim 10, wherein said inverting circuit includes a first transistor whose gate is connected to a node one for connecting said signal line and said sense/latch circuit, and second and third transistors serially connected between an inverted node of said first latch circuit and a preset voltage terminal together with said first transistor, a gate of said second transistor being connected to an inverted node of said second latch circuit and a gate of said third transistor being supplied with an external signal.

13. A multi-level nonvolatile semiconductor memory device according to claim 2, wherein the memory cell stores four-level information.

14. A multi-level nonvolatile semiconductor memory device according to claim 8, wherein the memory cell stores four-level information.

15. A multi-level nonvolatile semiconductor memory device according to claim 2, wherein a verify operation for data written into said memory cells in each write phase is effected when multi-level information is written into the memory cells.

16. A multi-level nonvolatile semiconductor memory device according to claim 15, which further comprises a verify circuit for inverting the voltage level of one of the nodes of one of said first and second latch circuits of said sense/latch circuit according to the verify result; and a detection circuit voltage for detecting the voltage level of said one of the nodes of one of said first and second latch circuits; and in said detection circuit whether or not data is sufficiently written into a plurality of memory cells is simultaneously detected in each write phase.

17. A multi-level nonvolatile semiconductor memory device according to claim 16, wherein said detection circuit includes a detection line which can be precharged, a first connection circuit including first, second and third transistors serially connected between said detection line and a preset voltage terminal, and a second connection circuit including fourth and fifth transistors serially connected between said detection line and a preset voltage terminal, said first and second connection circuits are connected in parallel between said detection line and said preset voltage terminal, said second, third and fifth transistors are transistors of a first conductivity type, said first and fourth transistors are transistors of a second conductivity type, a gate of said first transistor is connected to said one of the nodes of said first latch circuit, a gate of said second transistor is connected to said one of the nodes of said second latch circuit, a gate of said third transistor is supplied with a first verify signal, a gate of said fourth transistor is connected to said one of the nodes of said second latch circuit, and a gate of said fifth transistor is supplied with a second verify signal.

18. A multi-level nonvolatile semiconductor memory device according to claim 8, wherein a verify operation for data written into the memory cells is effected in each write phase at the time of writing of multi-level information into said memory cells.

19. A multi-level nonvolatile semiconductor memory device according to claim 18, which further comprises a verify circuit for inverting the voltage level of one of nodes of one of said first and second latch circuits of said sense/latch circuit according to the verify result; and a detection circuit for detecting the voltage level of said one of the nodes of one of said first and second latch circuits; and in said detection circuit whether or not data is sufficiently written into a plurality of memory cells is simultaneously detected in each write phase.

20. A multi-level nonvolatile semiconductor memory device according to claim 19, wherein said detection circuit includes a detection line which can be precharged, a first connection circuit including first, second and third transistors serially connected between said detection line and a preset voltage terminal, and a second connection circuit including fourth, fifth and sixth transistors serially connected between said detection line and a preset voltage terminal, said first and second connection circuits are connected in parallel between said detection line and said preset voltage terminal, said second, third, fifth and sixth transistors are transistors of a first conductivity type, said first and fourth transistors are transistors of a second conductivity type, a gate of said first transistor is connected to said one of the nodes of said first latch circuit, a gate of said second transistor is connected to said one of the nodes of said second latch circuit, a gate of said third transistor is supplied with a first verify signal, a gate of said fourth transistor is connected to said one of the nodes of said second latch circuit, a gate of said fifth transistor is connected to said one of the nodes of said first latch circuit, and a gate of said sixth transistor is supplied with a second verify signal.

* * * * *